United States Patent [19]

Wang et al.

[11] Patent Number: 4,895,812

[45] Date of Patent: Jan. 23, 1990

[54] METHOD OF MAKING OHMIC CONTACT TO FERROELECTRIC SEMICONDUCTORS

[75] Inventors: Da Y. Wang, Lexington; Daniel T. Kennedy, Burlington, both of Mass.; Burton W. MacAllister, Jr., Hudson, N.H.

[73] Assignee: GTE Laboratories Incorporated, Waltham, Mass.

[21] Appl. No.: 284,037

[22] Filed: Dec. 14, 1988

[51] Int. Cl.$^4$ ............................................ H01L 21/44
[52] U.S. Cl. ................................... 437/180; 437/245; 437/247; 437/19; 437/187; 437/39; 252/520; 148/DIG. 93; 148/DIG. 94
[58] Field of Search ................... 437/180, 39, 187, 19, 437/245, 247; 148/DIG. 93, DIG. 94

[56] References Cited

U.S. PATENT DOCUMENTS

| | | | |
|---|---|---|---|
| 3,962,146 | 6/1976 | Matsuoka et al. | 252/520 |
| 4,261,764 | 4/1981 | Narayan | 437/187 |
| 4,772,985 | 9/1988 | Yasumoto et al. | 361/321 |

*Primary Examiner*—Brian E. Hearn
*Assistant Examiner*—M. Wilczewski
*Attorney, Agent, or Firm*—J. Stephen Yeo

[57] ABSTRACT

A layer of chemically compatible conductive material is applied to ferroelectric semiconductor material having a permanent polarization below its Curie temperature. The materials are heated to a temperature above the Curie temperature of the ferroelectric semiconductor material and allowed to cool. The result is a low resistance contact. The ferroelectric semiconductive material may be a layer on a non ferroelectric semiconductor material with a matching work function or matching dopant levels.

16 Claims, No Drawings

METHOD OF MAKING OHMIC CONTACT TO FERROELECTRIC SEMICONDUCTORS

BACKGROUND OF THE INVENTION

This invention pertains to methods of making ohmic contacts to semiconductors and more particular is concerned with a method of making ohmic contact to ferroelectric semiconductors.

One known method to make ohmic contact electrodes uses a metal or metal alloy which has a work function which matches that of the semiconductor which need to be electroded. Because the work functions of both materials match, no electrical barrier height is formed at the electrode junction and an ohmic contact electrode is thus obtained. It is, however, difficult to find an electrode material which has matching work function to that of a particular semiconducting material and still has satisfactory engineering properties.

Another method calls for having the surface of the semiconducting material heavily doped (either n type or p type), such that the electrical barrier at the electrode junction created due to the mismatch of work function of both materials has a narrow profile and charge carriers such as electrons and holes have no difficulty quantum-tunnelling through the potential barrier. The difficulty is that not all semiconducting materials can be heavily doped without having the dopant charge compensation mechanism changed. If the dopant charge compensation mechanism is changed and the dopants can be charge compensated by defects other than free electrons or holes, a narrow profile of electrical barrier will not be built and no ohmic contact can be formed.

An object of the invention is to provide a method of forming ohmic contact electrodes to semiconductors which does not require work-function matching nor heavy doping.

SUMMARY OF THE INVENTION

According to the method of the invention, a layer of chemically compatible conductive material is applied to ferroelectric semiconductor material having a permanent polarization below its Curie temperature. The materials are heated to a temperature above the Curie temperature of the ferroelectric semiconductor material and then allowed to cool. The result is a low resistance contact.

DETAILED DESCRIPTION OF THE INVENTION

According to the method of the invention, a semiconducting ferroelectric material which has permanent polarization below the Curie temperature of the material (ferro-para transition) is used as an ohmic contact substrate material. A known example of such a material is barium titanate, $BaTiO_3$, which is semiconducting when doped with one or more alio-valent dopant. See for example, W. Heywang "Semiconducting Barium Titanates", J. Materials Science 6, (1971) pp. 1214–1226. An alio-valent dopant has a valence different than that of the host. Suitable alio-valent dopants are Y, Sb, Sc, V, W, Cr, Ni, Rh, Ru, and any element of the lanthanide group (doping percentage 0.–1 m/0). The Curie temperature can be changed by adding one or more moderating dopants to the host ferroelectric material. Dopants which result in Curie temperature modulation are Ca, Zr, Sn, Pb, Hf, and Sn (doping percentage 0.–60 m/0).

On top of this semiconducting ferroelectric material, an electrode material will be applied. The electrode material can be any type of material as long as it has reasonable electrical conductivity and is chemically compatible, i.e., will not chemically react with the ferroelectric material to form insulating products.

Such electrode material can be any metal or metal alloy. Other examples of electrode materials are electrically-conducting ceramics (such as TiN, ZnO, $SnO_{2-x}$, and doped $In_2O_3$), and electronic-conducting organic polymers. It is known that $SnO_2$ may be reduced during the doping process. The method of electrode deposition can be by any physical deposition method such as physical vaporization, thermal vacuum deposition, arc spray, plasma, arc plasma, DC and AC sputter, brush, or screen-printing. Chemical vaporization method, such as metallic organic chemical vapor deposition can also be used for electrode deposition. The only preclusion for possible electrode material applied methods is that no insulating material should be formed during the applied procedure due to chemical interaction between the electrode material and the ferroelectric semiconducting materials. During or after the electrode application, the materials are exposed to a temperature higher than the ferroelectric material's Curie point and lower than what would cause chemical reactions or physical degradation. After this temperature treatment, the procedure for ohmic contact is completed and the materials are allowed to cool. The heating-up treatment could use a hot furnace, hot plate, hot air gun, or thermal irradiation. The temperature treatment is very important as the junction resistance is modulated by the temperature to which it is exposed.

EXAMPLE

| | |
|---|---|
| Ferroelectrical material | $BaTiO_3$ Semiconducting properties are given by 0.3 m/o Y dopant. The Curie temperature is moderated by 16 m/o Ca dopant and 3.5 m/o Sn dopant. |
| Curie temperature | 120° C. |
| Electrode material | Au |
| Method of Au deposition | DC sputtering method Cathode: Au Gas: Ar Pressure: $3 \times 10^{-1}$ mbar Voltage: 1 kV Current: 40 mA |

During deposition, the sample was water-cooled. The impedance of the $Au/BaTiO_3$ junction was studied by using the AC complex impedance method. Right after the Au deposition, the junction resistance was as high as 690 Ohm-cm$^2$. The sample was heated to various exposed temperatures and allowed to cool to room temperature. Repeated exposure indicated that when the maximum exposed temperatures were gradually increased, the room temperature junction resistance shrank and finally became close to zero after the exposed temperature exceeded the sample's Curie temperature (120° C.).

The fact that ohmic contacts are formed by this method can be explained by the trapped charges at electrode junction being compensated by the permanent dipole movement of the ferroelectric material, which leaves no potential barrier at the junction, so that the electrode makes ohmic contact with the ferroelectric material.

This method can be applied to form an ohm contact to nonferroelectric, semiconducting material. The procedure involves depositing (by CVD or PVD method) a ferroelectric semiconducting material on top of a nonferroelectric-semiconducting material; the dopant level on both sides of the materials needs to be selected so that no major potential barrier will be created. Then electrode materials can be applied to the top of the ferroelectric semiconducting material according to the previously described procedure to form an ohmic contact junction. Alternatively, the non-ferroelectric material and ferroelectric material are selected to have matching work functions.

The preferred embodiment and best mode of practicing the invention has been described. With these teachings variations of the method will be apparent to those skilled in the art, particularly is substitutions of materials. Accordingly, the scope of the invention is to be determined by the following claims.

What is claimed is:

1. A method of fabricating an ohmic contact to a semiconducting ferroelectric material comprising the steps of:
   providing a semiconducting ferroelectric material having a permanent polarization below the Curie temperature of the ferroelectric material;
   depositing a layer of chemically compatible electrically conductive material to a surface of said ferroelectric material;
   heating the ferroelectric material and layer of electrically conductive material to a temperature about the Curie temperature of the ferroelectric material and lower then what would cause chemical reactions or physical degradation of the materials; and
   allowing said ferroelectric material and layer of conductive material to cool below the Curie temperature of said ferroelectric material.

2. The method of claim 1 wherein said semiconductor ferroelectric material is barium titanate doped with one or more alio-valent dopants.

3. The method of claim 2 wherein said alio-valent dopant is selected from the group consisting of Y, Sb, Sc, V, W, Cr, Ni, Rh, Ru, and combinations thereof.

4. The method of claim 3 wherein the semiconductor ferroelectic material also includes one or more dopants selected from the group consisting of Ca, Zr, Sn, Pb, Hf, and Sn.

5. The method of claim 4 wherein said semiconductor ferroelectric material is barium titanate doped with 0.3 m/o Y, 16 m/o Ca, and 3.5 m/o Sn and said Curie temperature is 120° C.

6. The method of claim 1 wherein said conductive material is Au.

7. The method of claim 6 wherein said Au is deposited by DC sputtering.

8. The method of claim 1 wherein said conductive material is selected from the group consisting of metals, metal alloys, conductive ceramics, conductive polymers, and combinations thereof.

9. A method of fabricating an ohmic contact comprising the steps of:
   providing a nonferroelectric semiconducting material having a first work function;
   applying a layer of a semiconductor ferroelectric material having a permanent polarization below the Curie temperature of the ferroelectric material and having a second work function matching the first work function;
   depositing a layer of chemically compatible electrically conductive material to said layer of ferroelectric material;
   heating said layers of ferroelectric material and electrically conductive material to a temperature above the Curie temperature of the ferroelectric material and lower than what would cause chemical reactions or physical degradation of the materials; and
   allowing said ferroelectric material and conductive material to cool below the Curie temperature of said ferroelectric material.

10. The method of claim 9 wherein said semiconductor ferroelectric material is barium titanate doped with a percentage of one or more alio-valent dopants.

11. The method of claim 10 wherein said alio-valent dopant is selected from the group consisting of Y, Sb, any element of the lanthanide group, Sc, V, W, Cr, Ni, Rh, Ru, and combinations thereof.

12. The method of claim 11 wherein the semiconductor ferroelectric material also includes a percentage of one or more dopants selected from the group consisting of Ca, Zr, Sn, Pb, Hf, and Sn.

13. A method of fabricating an ohmic contact comprising the steps of:
   providing a nonferroelectric semiconducting material having a first dopant level;
   applying a layer of a semiconductor ferroelectric material having a permanent polarization below the Curie temperature of the ferroelectric material and having a second dopant level, said first and second dopant levels selected to minimize any electrical barrier at the junction of the semiconducting materials;
   depositing a layer of chemically compatible electrically conductive material to said layer of ferroelectric material;
   heating said layers of ferroelectric material and electrically conduction material to a temperature above the Curie temperature of the ferroelectric material and lower than what would cause chemical reactions or physical degradation of the materials; and
   allowing said ferroelectric material and conductive material to cool below the Curie temperature of said ferroelectric material.

14. The method of claim 13 wherein said semiconductor ferroelectric material is barium titanate doped with one or more alio-valent dopants.

15. The method of claim 14 wherein said alio-valent dopant is selected from the group consisting of Y, Sb, Sc, V, W, Cr, Ni, Rh, Ru, and combinations thereof.

16. The method of claim 15 wherein the semiconductor ferroelectric material also includes one or more dopants selected from the group consisting of Ca, Zr, Sn, Pb, Hf, and Sn.

* * * * *

UNITED STATES PATENT AND TRADEMARK OFFICE
CERTIFICATE OF CORRECTION

PATENT NO. : 4,895,812

DATED : January 23, 1990

INVENTOR(S) : Da Y. Wang, Daniel T. Kennedy, Burton W. MacAllister, Jr.

It is certified that error appears in the above-identified patent and that said Letters Patent is hereby corrected as shown below:

Claim 1 at column 3, line 33, "about" should read --above--.

Signed and Sealed this

Twenty-first Day of May, 1991

Attest:

HARRY F. MANBECK, JR.

Attesting Officer

Commissioner of Patents and Trademarks